US012302710B2

(12) United States Patent
Yang et al.

(10) Patent No.: US 12,302,710 B2
(45) Date of Patent: May 13, 2025

(54) DISPLAY SUBSTRATE AND ELECTRONIC APPARATUS

(71) Applicants: YUNNAN INVENSIGHT OPTOELECTRONICS TECHNOLOGY CO., LTD., Kunming (CN); BOE TECHNOLOGY GROUP CO., LTD., Beijing (CN)

(72) Inventors: Zongshun Yang, Beijing (CN); Hongtao Yu, Beijing (CN); Kuanta Huang, Beijing (CN)

(73) Assignees: YUNNAN INVENSIGHT OPTOELECTRONICS TECHNOLOGY CO., LTD., Kunming (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/793,790

(22) PCT Filed: Aug. 11, 2021

(86) PCT No.: PCT/CN2021/112067
§ 371 (c)(1),
(2) Date: Jul. 19, 2022

(87) PCT Pub. No.: WO2023/015487
PCT Pub. Date: Feb. 16, 2023

(65) Prior Publication Data
US 2024/0179951 A1 May 30, 2024

(51) Int. Cl.
*H10K 59/122* (2023.01)
*H10K 59/80* (2023.01)

(52) U.S. Cl.
CPC ..... *H10K 59/122* (2023.02); *H10K 59/80521* (2023.02)

(58) Field of Classification Search
None
See application file for complete search history.

(56) References Cited

U.S. PATENT DOCUMENTS 7,579,040 B2    8/2009  Lee et al.
7,839,081 B2    11/2010 Kubota et al.
(Continued)

FOREIGN PATENT DOCUMENTS

CN    103413819 A    11/2013
CN    103915572 A    7/2014
(Continued)

OTHER PUBLICATIONS

US Office Action issued in U.S. Appl. No. 17/793,765 on Mar. 5, 2025.

*Primary Examiner* — Michelle Mandala
(74) *Attorney, Agent, or Firm* — Dilworth & Barrese, LLP.; Michael J. Musella, Esq.

(57) ABSTRACT

A display substrate and an electronic apparatus are provided. The display substrate includes a base substrate, and a dielectric layer, a first electrode layer and a pixel defining layer thereon. The first electrode layer includes a first electrode and a second electrode spaced. The pixel defining layer includes a pixel defining portion between a first and a second opening region. The first electrode includes a first and a second surface away from the base substrate, and the second surface is closer to the base substrate than the first surface; the display substrate has a cross section perpendicular to the base substrate; within the cross section and along a first direction parallel to a plate surface of the base substrate, portions of the pixel defining portion on the first surface and the second surface of the first electrode respectively have lengths denoted by d1 and d2; d1 is less than d2.

20 Claims, 5 Drawing Sheets

(56) References Cited

U.S. PATENT DOCUMENTS

| | | | |
|---|---|---|---|
| 9,373,814 | B2 | 6/2016 | Liu et al. |
| 9,653,526 | B2 | 5/2017 | Li |
| 11,778,886 | B2* | 10/2023 | Li ................... G02F 1/16756 313/519 |
| 2004/0113550 | A1* | 6/2004 | Adachi ............. H10K 59/8722 313/512 |
| 2010/0052518 | A1 | 3/2010 | Jeon et al. |
| 2014/0191210 | A1 | 7/2014 | Sung |
| 2016/0020424 | A1 | 1/2016 | Kim et al. |
| 2016/0248035 | A1 | 8/2016 | Hwang et al. |
| 2016/0343786 | A1 | 11/2016 | Zhang et al. |
| 2021/0091152 | A1 | 3/2021 | Yang et al. |
| 2022/0336556 | A1* | 10/2022 | Wang ................... H10K 59/124 |
| 2024/0179950 | A1* | 5/2024 | Yang ................... H10K 59/353 |

FOREIGN PATENT DOCUMENTS

| | | |
|---|---|---|
| CN | 104393492 A | 3/2015 |
| CN | 104518004 A | 4/2015 |
| CN | 105914300 A | 8/2016 |
| CN | 110491907 A | 11/2019 |
| CN | 110610975 A | 12/2019 |
| CN | 212182332 U | 12/2020 |
| JP | 2000-181366 A | 6/2000 |
| JP | 2004-259696 A | 9/2004 |
| JP | 2005-174940 A | 6/2005 |
| JP | 2007-188653 A | 7/2007 |
| KR | 10-0749490 B1 | 8/2007 |

* cited by examiner

DISPLAY SUBSTRATE AND ELECTRONIC APPARATUS

TECHNICAL FIELD

Embodiments of the present disclosure relate to a display substrate and an electronic apparatus.

BACKGROUND

A micro organic light-emitting diode (OLED) display involves a combination of the OLED technology and the silicon based complementary metal oxide semiconductor (CMOS) technology and is related to the cross integration of the photoelectronic industry and the microelectronic industry, which not only promotes the development of the new generation micro display technology but also pushes forward the research and development of organic electronics on silicon and even molecular electronics on silicon.

The micro OLED display exhibits excellent display characteristics, such as high resolution, high brightness, rich colors, low driving voltage, high response speed, and low power consumption, and has vast potential for future development.

SUMMARY

At least one embodiment of the present disclosure provides a display substrate, comprising a base substrate, a dielectric layer located on the base substrate, and a first electrode layer, a pixel defining layer, an organic functional layer and a second electrode layer which are stacked successively on a side, away from the base substrate, of the dielectric layer. The base substrate comprises a base substrate comprising a first subpixel region and a second subpixel region adjacent to each other, the first electrode layer comprises a first electrode in the first subpixel region and a second electrode in the second subpixel region, the pixel defining layer comprises a first opening region, a second opening region, and a pixel defining portion located between the first opening region and the second opening region; the first opening region exposes at least a portion of the first electrode, and the second opening region exposes at least a portion of the second electrode, and the pixel defining portion further covers a portion of the first electrode and a portion of the second electrode; the first electrode comprises a first surface and a second surface which are away from the base substrate, and the second surface of the first electrode is closer to the base substrate than the first surface of the first electrode; the display substrate has a cross section perpendicular to the base substrate; within the cross section and along a first direction parallel to a plate surface of the base substrate, a portion of the pixel defining portion on the first surface of the first electrode has a length denoted by d1, and a portion of the pixel defining portion on the second surface of the first electrode has a length denoted by d2; d1 is less than d2.

In some examples, the first electrode comprises a first sub-electrode and a second sub-electrode which are stacked, and the second sub-electrode is on a side, which is away from the dielectric layer, of the first sub-electrode; and the second sub-electrode covers a side surface of the first sub-electrode and is in contact with the dielectric layer to form the second surface of the first electrode.

In some examples, a portion, which is in contact with the second surface of the first electrode, of the pixel defining portion has an average thickness greater than an average thickness of the first electrode at the second surface.

In some examples, a gap is present between the first electrode and the second electrode; a portion, which is corresponding to the gap, of the dielectric layer comprises a first groove, and the gap exposes the first groove; the pixel defining portion covers the first groove to form a second groove; the gap further exposes a first exposion portion of the dielectric layer; the first exposion portion is between a first electrode edge of the first electrode close to the first groove, and a first groove edge of the first groove facing the first electrode; and within the cross section and along the first direction, a distance between a first side surface, close to the first electrode, of the second groove and the first electrode edge is denoted by d3, and d3 is greater than d1.

In some examples, within the cross section and in the first direction, a portion, which is on a side of the first side surface of the second groove close to the first electrode, of the pixel defining portion has a length denoted by y1, and the second groove has a maximum length denoted by d4; and y1 is less than d4.

In some examples, a portion, corresponding to the first groove, of the second electrode layer comprises a concave structure; the concave structure comprises a first concave point and a second concave point within the cross section; orthographic projections of the first concave point and the second concave point on the base substrate are both within an orthographic projection of the second groove on the base substrate; and a distance between the first concave point and the first side surface of the second groove in the first direction is denoted by d5, and d5 is greater than d1.

In some examples, a distance between the first concave point and the second concave point in the first direction is denoted by d6, and y1 is greater than d6.

In some examples, the first concave point and the second concave point have different distances to the base substrate.

In some examples, the second electrode layer comprises a protrusion portion which is at least partially overlapped with the first electrode in a direction perpendicular to the base substrate; the protrusion portion has a first protrusion point within the cross section; and a protrusion height of the first protrusion point is greater than an average thickness of the second electrode layer.

In some examples, the concave structure further comprises a second protrusion point within the cross section, and the second protrusion point is between the first concave point and the second concave point; a distance of the second protrusion point to the base substrate is greater than a distance of each of the first concave point and the second concave point to the base substrate; and a smaller value of a height difference between the second protrusion point and the first concave point and a height difference between the second protrusion point and the second concave point is denoted by Δh.

In some examples, Δh is greater than a height difference between the first concave point and the second concave point.

In some examples, Δh is less than the protrusion height of the first protrusion point.

In some examples, the second electrode layer has different thicknesses at the first concave point and the second concave point.

In some examples, the pixel defining portion comprises a first surface away from the base substrate; an orthographic projection of the first surface on the cross section is a first curve, the first curve has a first tangent line at an endpoint close to the first electrode, and the first tangent line intersects the first direction.

In some examples, the first curve has a second tangent line at an endpoint close to the second electrode, and the second tangent line intersects the first direction; and the first tangent line and the second tangent line form different included angles with the first direction.

In some examples, an intersection point of the first tangent line and the plate surface of the base substrate is on a side, close to the second electrode, of the first electrode.

In some examples, the first opening region has a length different from a length of the second opening region in the first direction.

In some examples, the first opening region has a first edge and a second edge which are within the cross section and are opposite in the first direction; and the first edge and the second edge form different included angles with the first surface of the first electrode.

In some examples, the second electrode comprises a first surface away from the base substrate, and the first surface of the second electrode is parallel to the surface of the base substrate; within the cross section and in the first direction, a portion of the pixel defining portion on the first surface of the second electrode has a length denoted by d1'; and d1 is not equal to d1'.

At least an embodiment of the present disclosure further provides an electronic apparatus, comprising the display substrate provided by any one of the above embodiments.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
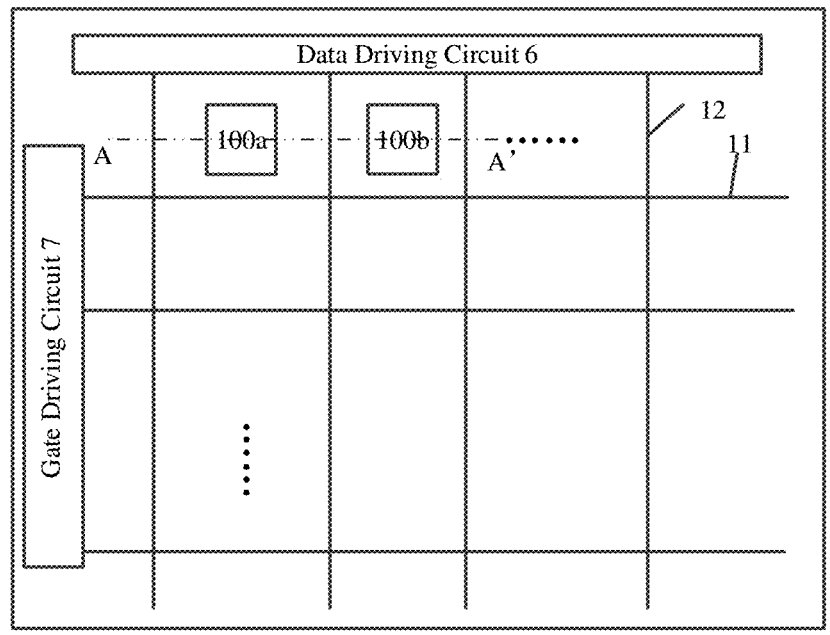
FIG. 1 is a planar schematic diagram of a display substrate provided in some embodiments of the present disclosure.

In order to mark the objectives, technical solutions and advantages of the embodiments of the present disclosure obvious, the technical solutions of the embodiments of the present disclosure are clearly and completely described below in conjunction with the accompanying drawings of the embodiments of the present disclosure. It will be obvious that the described embodiments are part of the embodiments of the present disclosure, rather than all the embodiments. Based on the described embodiments of the present disclosure, all other embodiments derived by those skilled in the art without efforts are intended to be included within the scope of the following claims.

Unless otherwise defined, the technical terms or scientific terms used in the present disclosure shall have ordinary meanings as understood by those of ordinary skills in the art to which the present disclosure belongs. Phrases such as "the first", "the second", or the like, used in the present disclosure do not indicate any order, quantity or importance, but are only used to distinguish one component from another. Phrases such as "including" or "include" or the like, mean that the element or object before that word covers the elements or objects and their equivalents listed after that word, without excluding other elements or objects. Phrases such as "connect" or "in connection with" or the like, are not limited to physical or mechanical connections, but may include electrical connections, regardless of directly or indirectly. Phrases "up", "down", "left", "right", etc., are only used to indicate the relative positional relationship. When the absolute position of the described object changes, the relative positional relationship may also change accordingly.

A micro OLED display typically has a size of less than 100 microns, for example, a size of less than 50 microns, and involves a combination of the OLED technology and the CMOS technology, by which an OLED array is prepared on a silicon based substrate including a CMOS circuit.

An OLED device is usually formed by evaporation of different organic functional layers (e.g., an electron/hole injection layer) with a fine metal mask (FMM). For example, the organic functional layers are patterned with the FFM to form corresponding patterns in different pixel regions. However, due to limited precision of the FMM, it is impossible to realize a high image resolution (i.e., pixels per inch, PPI), which in turn imposes a limitation on the resolution of the OLED device. Therefore, a white OLED may be combined with a color film to realize full-color display. However, in such a process, the organic functional layer is usually formed as a continuous structure covering a plurality of subpixel regions, which causes electric leakage to easily occur in the transverse direction, leading to cross color between subpixels and a reduced color gamut of the resulting display device. For example, the organic functional sublayer such as a carrier injection layer (e.g., an electron injection layer (EIL), a hole injection layer (HIL), a light-emitting layer, and a charge generation layer (CGL) in the OLED device often includes metal elements, e.g., metal ions or heavily doped materials including metal elements, and therefore, moving charges will be generated under the action of a voltage, thus causing electric leakage between subpixels in the transverse direction and then giving rise to the cross color problem.

For example, a substrate structure may be designed so that an organic functional layer is depressed between subpixels, resulting in natural disconnection of an electric leakage structure (e.g., a carrier injection layer) in the organic functional layer at the concave. Thus, cross color between subpixels caused by transverse electric leakage of the organic functional layer can be effectively prevented. The color gamut of the display substrate can be increased and the display quality can be improved.

The inventors have found that the concave of an organic functional layer would result in a corresponding concave of an upper electrode layer (e.g., a cathode), which is formed above the organic functional layer, of a light-emitting element, thus shortening the distance between the upper electrode layer to a lower electrode layer (e.g., an anode) of the organic functional layer and increasing the risk of short circuit. Moreover, the upper electrode layer is prone to being needle-shaped at the concave, which may easily give rise to point discharge, thus further increasing the rise of short circuit between the upper and lower electrode layers.

At least one embodiment of the present disclosure provides a display substrate including a base substrate, a dielectric layer located on the base substrate, and a first electrode layer, an organic functional layer and a second electrode layer that are located on the side, away from the base substrate, of the dielectric layer and stacked successively. The first electrode layer includes a first electrode located in a first subpixel region and a second electrode located in a second subpixel region. A gap is present between the first electrode and the second electrode. The dielectric layer is provided with a first groove corresponding to the gap, and the gap exposes the first groove. The second electrode layer includes a concave structure at a position corresponding to the first groove. The gap further exposes a first exposion portion, located between the first electrode and the first groove, of the dielectric layer.

In the display substrate provided in at least one embodiment of the present disclosure, the first groove is formed in the dielectric layer below at a position corresponding to the gap between subpixels so that the organic functional layer is depressed between subpixels, resulting in natural disconnection of an electric leakage structure in the organic functional layer at the concave. Thus, cross color between subpixels caused by transverse electric leakage of the organic functional layer can be effectively prevented. The color gamut of the display substrate can be increased and the display quality can be improved. Meanwhile, by providing the first exposion portion, the spacing between an edge of the first electrode and an edge of the first groove is increased so that the distance of the first electrode to the concave structure of the second electrode layer is increased, thereby reducing the risk of short circuit between the first electrode and the second electrode layer and increasing the product yield.

FIG. 1 is a planar schematic diagram of a display substrate provided in an embodiment of the present disclosure. As shown in FIG. 1, the display substrate 20 includes a plurality of gate lines 11 and a plurality of data lines 12. The plurality of gate lines 11 and the plurality of data lines 12 cross one another to define in a display area a plurality of subpixel regions distributed as an array. Each subpixel region has one subpixel, and each subpixel includes a light-emitting element and a driving circuit for driving the light-emitting element. The driving circuit is, for example, a conventional pixel circuit. For example, the driving circuit includes a conventional nTmC (n and m being positive integers) such as 2T1C (i.e., two transistors and one capacitor), 4T2C, 5T1C or 7T1C pixel circuit, and in different embodiments, the driving circuit may further include a compensating circuit which includes an internal compensating circuit or an external compensating circuit. The compensating circuit may include a transistor, a capacitor, etc. For example, as needed, the driving circuit may further include a reset circuit, a light-emitting control circuit, a detection circuit, etc.

For example, the display substrate may also include a data driving circuit 6 and a gate driving circuit 7 that are connected to the driving circuit for the light-emitting element through the data lines 12 and the gate lines 11, respectively, to provide electric signals. The data driving circuit is configured to provide a data signal, and the gate driving circuit is configured to provide a scanning signal, which may be further configured to provide various control signals, power signals, etc.

It needs to be noted that FIG. 1 schematically illustrates only the connection relationship of the gate driving circuit and the data driving circuit to subpixels, which does not represent their actual positional relationship and shall not be construed as a limitation to the present disclosure. For example, the display substrate uses a silicon substrate as the base substrate 101, and the driving circuit (the pixel circuit), the gate driving circuit 6 and the data driving circuit 7 may all be integrated on the silicon substrate. In this case, since a silicon based circuit may allow for high precision, the gate driving circuit 6 and the data driving circuit 7 may be formed, for example, in a region corresponding to the display area of the display substrate.

Figure 2:
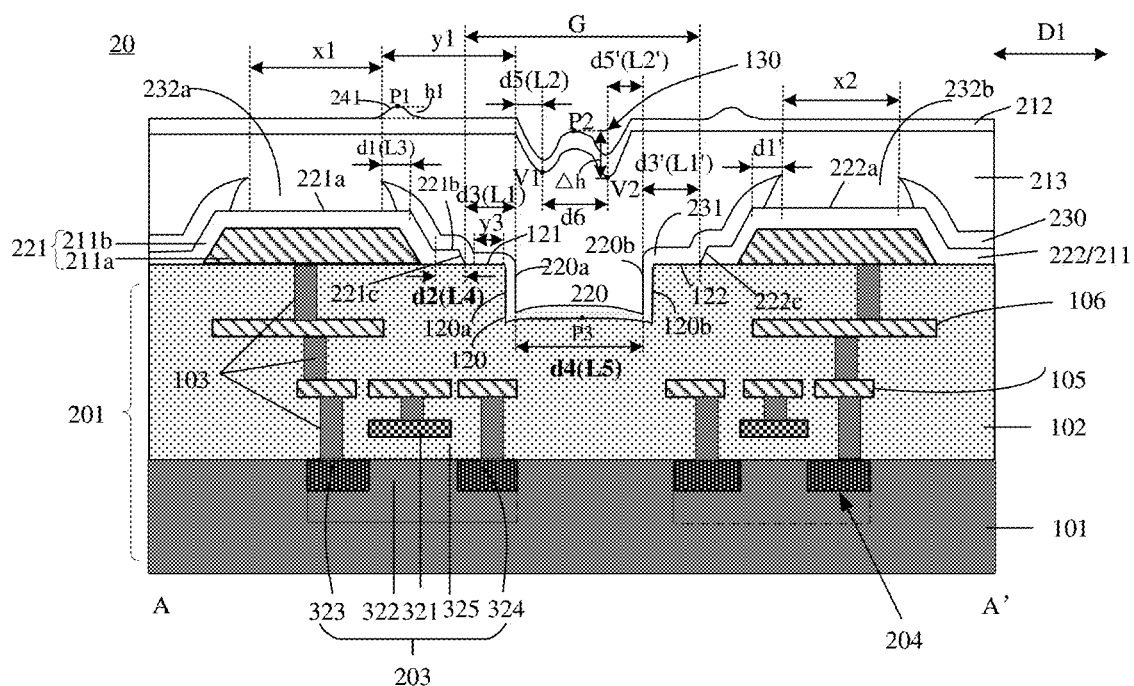
FIG. 2 is a first sectional view of a display substrate provided in some embodiments of the present disclosure.

FIG. 2 illustrates an example of a sectional view of the display substrate shown in FIG. 1 taken along section line A-A'.

For the sake of clarity, FIG. 2 illustrates merely a first subpixel 100a and a second subpixel 100b in the adjacent first and second subpixel regions, and with regard to each subpixel, only a light-emitting element and a transistor directly connected to the light-emitting element in a pixel driving circuit are illustrated. For example, the transistor may be a driving transistor which is configured to control the magnitude of a current for driving the light-emitting element to emit light. For example, the transistor may also be a light-emitting control transistor which is configured to control whether the current for driving the light-emitting element to emit light flows therethrough. The embodiments of the present disclosure have no particular limitation on the transistor.

As shown in FIG. 2, the display substrate 20 includes a base substrate 101, a dielectric layer 102 located on the base substrate 101, and a first electrode layer 211, a pixel defining layer 230, an organic functional layer 213 and a second electrode layer 212 that are located on the side, far away from the base substrate 101, of the dielectric layer and stacked successively. The first electrode layer 211 includes a plurality of electrodes spaced apart from one another, which serve as a plurality of pixel electrodes of a plurality of light-emitting elements of the display substrate, respectively. As shown in FIG. 2, the plurality of pixel electrodes include a first electrode 221 located in the first subpixel region and a second electrode 222 located in the second subpixel region. A gap G is present between the first electrode 221 and the second electrode 222.

The first electrode 221, the second electrode layer 212, and a portion, located between the first electrode 221 and the second electrode layer 212, of the organic functional layer 213 form the light-emitting element of the first subpixel, and the second electrode 222, the second electrode layer 212, and a portion, located between the second electrode 222 and the second electrode layer 212, of the organic functional layer 213 form the light-emitting element of the second subpixel.

The dielectric layer 102 is provided with a first groove 120 corresponding to the gap G, and the gap G exposes the first groove 120. In other words, the first groove 120 is formed between a first electrode edge 221c, facing the second electrode 221, of the first electrode 221 and a second electrode edge 222c, facing the first electrode, of the second electrode 222.

Due to the presence of the first groove 120, the organic functional layer 213 and the second electrode layer 212 formed thereabove have respective concave structures at positions corresponding to the first groove 120 so that the organic functional layer 213 is depressed between the first subpixel and the second subpixel, resulting in natural disconnection of an electric leakage structure in the organic functional layer at the concave. Thus, cross color between the first subpixel and the second subpixel caused by transverse electric leakage of the organic functional layer can be effectively prevented. The color gamut of the display substrate can be increased and the display quality can be improved.

Figure 3:
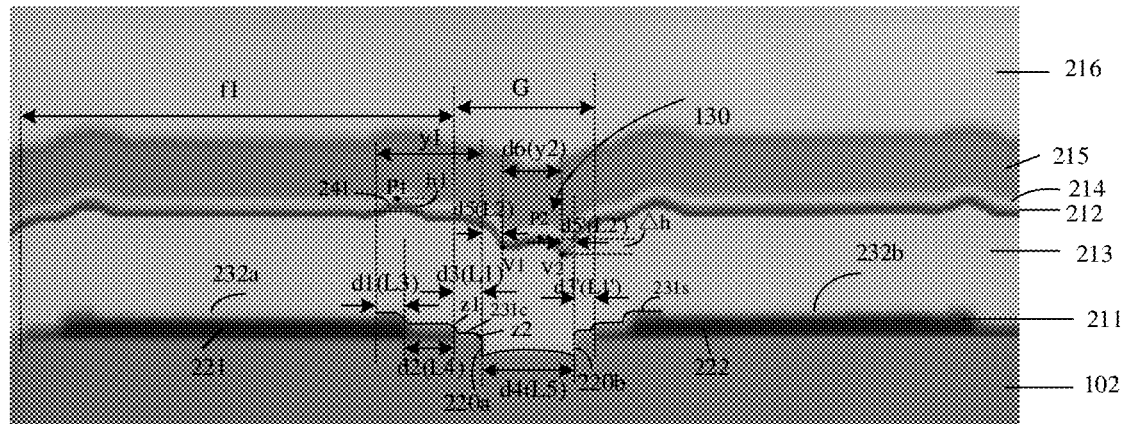
FIG. 3 is a second sectional view of a display substrate provided in some embodiments of the present disclosure.

FIG. 3 illustrates an example of an electron microscope image of the display substrate shown in FIG. 1 taken along section line A-A'. FIG. 3 merely shows a partial schematic diagram of the first groove 120 and the periphery thereof.

As shown in FIG. 2 and FIG. 3, the second electrode layer 212 includes a concave structure 130 at a position corresponding to the first groove 120. For example, the concave structure 130 is W-shaped within the cross section and has a first concave point V1 and a second concave point V2. The first concave point V1 is close to the first electrode 221, and the second concave point V2 is close to the second concave point V2. For example, the second electrode layer 212 is closer to the base substrate at the first concave point V1 than at the periphery of the first concave point V1 (e.g., in a range of 10 nanometers, 30 nanometers or 50 nanometers centered on the first concave point V1), and the second electrode layer is closer to the base substrate at the second concave point V2 than at the periphery of the second concave point V2 (e.g., in a range of 10 nanometers, 30 nanometers or 50 nanometers centered on the second concave point V2).

Figure 4:
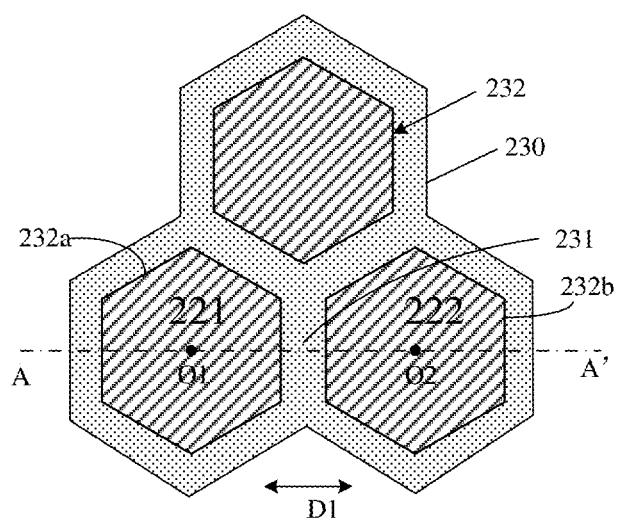
FIG. 4 is a planar schematic diagram of the first electrode layer and the pixel defining layer provided by some embodiments of the present disclosure.

FIG. 4 is a planar schematic diagram of the first electrode layer 211 and the pixel defining layer 230 provided in at least one embodiment of the present disclosure. Further, the position of section line A-A' is correspondingly shown in FIG. 4.

With reference to FIG. 2 to FIG. 4, the pixel defining layer 230 includes a plurality of opening regions 232. The plurality of opening regions 232 correspond to a plurality of pixel electrodes in the first electrode layer 211 in one to one correspondence, and each opening region exposes at least a portion of the corresponding pixel electrode to define a light-emitting region of each light-emitting element. For example, as shown in FIG. 2 to FIG. 4, the plurality of opening regions 232 include a first opening region 232a and a second opening region 232b. The first opening region 232a exposes at least a portion of the first electrode 221, and the second opening region 232b exposes at least a portion of the second electrode 222.

The organic functional layer 213 is in contact with each pixel electrode through each opening. For example, the first opening region 232a and the second opening region 232b of the pixel defining layer 230 expose at least a portion of the first electrode 221 and at least a portion of the second electrode 222, respectively.

The pixel electrode layer 230 further includes a pixel defining portion 231 located between the first opening region 232a and the second opening region 232b. The pixel defining portion 231 covers the first groove 120, and also a portion of the first electrode 221 and a portion of the second electrode 222, thereby insulating the ends, close to the concave structure 130, of the first electrode 221 and the second electrode 222 from the second electrode layer 212, respectively. Thus, the risk of short circuit between the first electrode layer 211 and the second electrode layer 212 is reduced.

As shown in FIG. 2 and FIG. 3, the pixel defining portion covers the first groove 120 and forms a second groove 220. The second groove 220 is formed by inheriting the morphology of the first groove 120 therebelow. Within the cross section and in a first direction D1 parallel to the plate surface of the base substrate, the second groove 220 has two opposite sidewalls, namely a first side surface 220a and a second side surface 220b, and the first side surface 220a is close to a first side surface 220a of the first electrode 221 and a second side surface 220b of the second electrode 222.

For example, the material of the pixel defining layer 230 is an inorganic insulating material, such as a nitride, an oxide or an oxynitride of silicon. The inorganic insulating material is harder than an organic material and is easy to shape, and thus is more suitable for a high-precision display substrate, e.g., a silicon based display substrate.

For example, the material of the pixel defining layer 230 is the same as or similar to the material of the dielectric layer 102.

For example, since the material of the pixel defining layer 230 is the same as or similar to the material of the dielectric layer 102, the boundary between the pixel defining layer 230 and the dielectric layer 102 cannot be clearly shown in the electron microscope image of FIG. 3.

For example, the orthographic projections of the first concave point V1 and the second concave point V2 on the base substrate are within the orthographic projection of the second groove 220 on the base substrate, i.e., between the first side surface 220a and the second side surface 220b. Within the cross section and in the first direction D1 parallel to the surface of the base substrate, the distance between the first concave point V1 and the second concave point V2 is denoted by d6 (also referred to as y2). The first subpixel is adjacent to the second subpixel in the first direction D1.

The distances of the first concave point V1 and the second concave point V2 to the first electrode layer 211 need to be controlled because if the distances are too large, the organic functional layer 213 cannot be depressed between subpixels sufficiently to cause natural disconnection of a functional sublayer prone to electric leakage therein. If the distances are too small, the risk of short circuit between the first electrode layer 211 and the second electrode layer 212 may be increased easily. Due to the point discharge effect, the risk of short circuit is high at the first concave point V1 and the second concave point V2.

For example, the first concave point V1 and the second concave point V2 have different distances to the base substrate 101. For example, as shown in FIG. 2 and FIG. 3, the second concave point V2 has a smaller distance to the base substrate 101. For example, an angle of the second electrode layer 212 at the second concave point V2 is more acute than an angle of the second electrode layer 212 at the first concave point V1.

This may increase the slope of the bottom of the concave structure 130, which is helpful to further increase a segment difference of the electric leakage structure in the organic functional layer 213 and make this structure easier to break.

The concave structure 130 and the second groove 220 are formed due to the presence of the first groove 120. The morphology of the concave structure 130 and the second groove 220 is related to an aspect ratio of the first groove 120. The second groove 220 substantially inherits the morphology of the first groove 120. For example, the aspect ratio of the first groove 120 is less than or equal to 0.5. For example, as shown in FIG. 2, a bottom edge of the cross-section shape of the first groove 120 is upwardly convex arc-shaped, which, however, is not limited in the embodiments of the present disclosure. In another embodiments, the cross-section shape of the first groove 120 within the cross section may also be a rectangle, a trapezoid, a triangle, etc. For example, within the cross section shown in FIG. 2, a ratio of the maximum size of the first groove 120 in a direction perpendicular to the base substrate to the maximum size of the first groove 120 in the first direction D1 is less than or equal to 0.5. For example, within the cross section shown in FIG. 2, a ratio of the maximum size of the second groove 220 in the direction perpendicular to the base substrate to the maximum size d4 of the second groove 220 in the first direction D1 is less than or equal to 0.5.

For example, as shown in FIG. 2 and FIG. 3, a ratio of the maximum size d4 of the second groove 220 in the first direction D1 to a length of the gap G in the first direction ranges from ½ to ⅔.

For example, in the direction perpendicular to the base substrate, the distance of the first concave point V1 to the base substrate is different from the distance of the second concave point V2 to the base substrate. As shown in FIG. 2, the second concave point V2 is closer to the base substrate 101.

For example, the second electrode layer 212 has different thicknesses at the first concave point V1 and the second concave point V2. This results from different concave degrees of the second electrode layer 212 at the first concave point V1 and the second concave point V2.

The gap G further exposes a first exposion portion 121 and a second exposion portion 122 of the dielectric layer 102, with the first exposion portion being located between a first electrode edge 221c, close to the first groove 120, of the first electrode 221 and a first groove edge 120a, facing the first electrode 221, of the first groove 120, and the second exposion portion being located between a second electrode edge 222c, close to the first groove 120, of the second electrode 222 and a second groove edge 120b, facing the second electrode 222, of the first groove 120. The first exposion portion 121 and the second exposion portion 122 are portions of the dielectric layer 102 that are not covered by the first electrode layer 211.

With the first exposion portion 121 and the second exposion portion 122, the spacings between the edge of the first electrode 221/the edge of the second electrode 222 and the edge of the first groove 120 are increased, respectively, so that the distances of the first electrode 221 to the first concave point V1 of the second electrode layer 212 and the distance of the second electrode 222 to the second concave point V2 are increased, respectively, thereby reducing the risk of short circuit between the first electrode layer and the second electrode layer.

As shown in FIG. 2 and FIG. 3, the first electrode 221 includes a first surface 221a far away from the base substrate, and the first surface 221a is an upper surface of the first electrode 221. For example, the first surface 221a is parallel to the surface of the base substrate, i.e., parallel to the first direction D1.

Within the cross section and in the first direction D1 parallel to the surface of the base substrate, a portion, located on the first surface 221a of the first electrode 221 (i.e., a portion overlapping the first surface 221a in the direction perpendicular to the base substrate), of the pixel defining portion 231 has a length denoted by d1 (also referred to as L3).

For example, the first direction D1 is a direction pointing from the first subpixel to the second subpixel, i.e., the first subpixel is adjacent to the second subpixel in the first direction. For example, as shown in FIG. 4, the first direction D1 may be a direction pointing from the geometric center O1 of the orthographic projection of the opening region of the first subpixel on the base substrate to the geometric center O2 of the orthographic projection of the opening region of the second subpixel on the base substrate. However, the present disclosure has no particular limitation on the first direction D1.

As shown in FIG. 2 and FIG. 3, the first electrode 211 further includes a second surface 221b far away from the base substrate. For example, the second surface 221b is parallel to the first direction D1, and the second surface 221b is parallel to the first surface 221a.

The second surface 221b is closer to the base substrate 101 than the first surface 221a. For example, as shown in FIG. 2, the first surface 221a and the second surface 221b are joined by a third surface which is an inclined surface. In FIG. 3, since the size of the third surface in the first direction D1 is very small and thus neglected, the first surface 221a and the second surface 221b may be approximated as a continuous surface.

For example, as shown in FIG. 2 and FIG. 3, the first electrode layer 211 includes a first sub-electrode layer and a second sub-electrode layer that are stacked together, with the second sub-electrode layer being located on the side, far away from the base substrate, of the first sub-electrode layer. The first electrode 221 and the second electrode 222 respectively include a first sub-electrode 211a and a second sub-electrode 211b which are stacked together, with the second sub-electrode 211b being located on the side, far away from the dielectric layer 102, of the first sub-electrode 211a. For example, the second sub-electrode 211b covers a side surface of the first sub-electrode 211a and is in contact with the dielectric layer 102 to form the second surface 221b of the first electrode 221. Thus, the first surface 221a and the second surface 221b of the first electrode 221 form a step-like structure so that the segment difference of the pixel defining portion 231 on the first electrode 221 is reduced. In the case where a material of the pixel defining layer is a brittle inorganic insulating material, the step-like structure may prevent the pixel defining layer from breakage due to a too large segment difference.

For example, a portion, in contact with the second surface 211b of the first electrode 211, of the pixel defining portion 231 has an average thickness greater than an average thickness of the first electrode 211 at the second surface 211b.

For example, the material of the first sub-electrode layer may include titanium (Ti), and the material of the second sub-electrode layer may include argentum (Ag). The material of the first sub-electrode layer has high electrical conductivity, and the contact resistance with circuits on the base substrate can be reduced. The material of the second sub-electrode layer has relatively high reflectivity, and the light emission efficiency of a top-emitting light-emitting element can be improved.

In another examples, the first electrode layer may also include a third sub-electrode layer located on the side, far away from the first sub-electrode layer, of the second sub-electrode layer. The material of the third sub-electrode layer is, for example, a transparent conductive material such as a high work-function conductive material (e.g., ITO, IZO, IGZO, AZO), and when such a material is in direct contact with the organic functional layer 213, a hole injection rate can be increased.

For example, the second electrode layer may be made of a low work function material, for example, a semi-transmitting metal or metal alloy material (e.g., an Ag/Mg alloy material), to serve as a cathode.

For example, as shown in FIG. 2 and FIG. 3, the second electrode layer 212 includes a first protrusion portion 241 which is at least partially overlapped with the first electrode 221 in the direction perpendicular to the base substrate.

For example, the first protrusion portion 241 corresponds to the position between the first surface 221a and the second surface 221b of the first electrode 221. For example, the first protrusion portion 241 results from the segment difference between the first surface 221a and the second surface 221b of the first electrode 221 or from the pixel defining portion 231.

For example, in the direction perpendicular to the base substrate, the first protrusion portion 241 is at least partially overlapped with each of the first surface 221a and the second surface 221b.

For example, in the direction perpendicular to the base substrate, the first protrusion portion 241 is at least partially overlapped with the pixel defining portion 231.

The first protrusion portion 241 has a first protrusion point P1 within the cross section. For example, the first protrusion portion 241 is further away from the base substrate at the first protrusion point P1 than at the periphery of the first protrusion point P1 (e.g., in a range of 10 nanometers, 30 nanometers or 50 nanometers centered on the first protrusion point P1). For example, the orthographic projection of the first protrusion point P1 on the base substrate is within the orthographic projection of the pixel defining portion 231 on the base substrate.

For example, a protrusion height h1 of the first protrusion point P1 is greater than the average thickness of the second electrode layer 212. For example, the protrusion height h1 is based on the plane of the second electrode layer 212 that is parallel to the first direction D1 (i.e., parallel to the surface of the base substrate).

For example, as shown in FIG. 2 and FIG. 3, the second electrode layer 212 includes a second protrusion portion (not shown) which is at least partially overlapped with the second electrode 222 in the direction perpendicular to the base substrate.

For example, the orthographic projection of the pixel defining portion 231 on the base substrate is between the orthographic projection of the first protrusion portion 241 on the base substrate and the orthographic projection of the second protrusion portion on the base substrate.

For example, the second protrusion portion also includes a protrusion point, and the orthographic projection of the protrusion point of the second protrusion portion on the base substrate falls into the orthographic projection of the pixel defining portion 231 on the base substrate.

For example, as shown in FIG. 2 and FIG. 3, the concave structure 130 further includes a second protrusion point P2 within the cross section. The second protrusion point P2 is located between the first concave point V1 and the second concave point V2. The distance of the second protrusion point P2 to the base substrate is greater than the distance of each of the first concave point V1 and the second concave point V2 to the base substrate.

For example, the second electrode layer 212 is further away from the base substrate at the second protrusion point P2 than at the periphery of the second protrusion point P2 (e.g., in a range of 10 nanometers, 30 nanometers or 50 nanometers centered on the second protrusion point P2).

For example, a greater value Δh of a height difference between the second protrusion point P2 and the first concave point V1 and a height difference between the second protrusion point P2 and the second concave point V2 is the protrusion height of the second protrusion point P2. As shown in FIG. 3, since the second concave point V2 is closer to the base substrate than the first concave point V1, the protrusion height Δh of the second protrusion point P2 is the height difference between the second protrusion point P2 and the second concave point V2.

For example, Δh is greater than the height difference between the first concave point and the second concave point.

For example, Δh is greater than the average thickness of the second electrode layer 212.

For example, as shown in FIG. 2, Δh is less than the protrusion height h1 of the first protrusion point P. However, this shall not be construed as a limitation to the embodiments of the present disclosure. For example, as shown in FIG. 3, Δh is greater than the protrusion height of the first protrusion point.

For example, as shown in FIG. 2, a bottom edge of the cross-section shape of the second groove 220 is upwardly convex arc-shaped and includes a third protrusion point P3 within the cross section. The third protrusion point P3 is located between the first concave point V1 and the second concave point V2. In other words, the orthographic projection of the third protrusion point P3 on the base substrate is between the orthographic projection of the first concave point V1 on the base substrate and the orthographic projection of the second concave point V2 on the base substrate.

For example, as shown in FIG. 2, the third protrusion point P3 has a curvature smaller than that of the first protrusion point P1, and the curvature of the third protrusion point P3 is smaller than that of the second protrusion point P2.

As shown in FIG. 2 and FIG. 3, within the cross section and in the first direction D1, a portion, located on the second surface 221b of the first electrode (i.e., a portion overlapping the second surface in the direction perpendicular to the base substrate), of the pixel defining portion 231 has a length denoted by d2 (also referred to as L4).

As shown in FIG. 2 and FIG. 3, within the cross section and in the first direction D1, the distance between the first side surface 220a of the second groove 220 and the first electrode edge 221c of the first electrode 221 is denoted by d3 (also referred to as L1).

Within the cross section, the distance d3 is greater than the distance d5 (also referred to as L2) between the first concave point V1 and the first side surface 220a (i.e., the side surface of the pixel defining layer) of the second groove 220.

This may mitigate and even avoid short circuit at a nearest position between the first electrode 221 and the second electrode layer 212 and between the first electrode 221 and the second electrode layer 212, and punch-through of the second electrode layer 212.

For example, as shown in FIG. 2 and FIG. 3, the pixel defining portion 231 includes a first surface (i.e., an upper surface) far away from the base substrate, and the first surface 231s of the pixel defining portion 231 is schematically illustrated by a curve in FIG. 3. The first surface 231s of the pixel defining portion includes a first inclined surface z1 corresponding to the first electrode edge 221c of the first electrode 221 and a second inclined surface z2 joined with the first side surface 220a.

In the direction perpendicular to the base substrate, the first inclined surface z1 overlaps, at least in part, the first electrode edge 221c, and the second inclined surface z2 overlaps, at least in part, the first groove edge 120a.

For example, as shown in FIG. 2 and FIG. 3, the first inclined surface z1 and the second inclined surface z2 both include curved surfaces. For example, shapes of the first inclined surface z1 and the second inclined surface z2 within the cross section both include an arc shape.

The first inclined surface z1 results from a step between the first sub-electrode 211a and the second sub-electrode 211b in the first electrode 221, and the second inclined surface z2 results from the first groove edge 120a of the first groove 120. For example, due to unsatisfactory isotropy of etching, the pixel defining layer, when covering the step shape below, may be formed into the shape of a curved surface rather than an ideal right angle.

For example, as shown in FIG. 2 and FIG. 3, the first surface 231s of the pixel defining portion 231 further includes a connection surface 231c located between the first inclined surface z1 and the second inclined surface z2. For example, the connection surface 231c is flat at least in part.

Since the distance d3 between the first side surface 220a of the second groove 220 and the first electrode edge 221c of the first electrode 221 is long enough, the first inclined surface z1 is not directly joined with the second inclined surface z2, and therefore, the first surface 231a has a flat transition portion between the first inclined surface z1 and the second inclined surface z2. For example, the connection surface 231c is flat in whole.

For example, as shown in FIG. 2, within the cross section, the connection surface 231c has a length y3 greater than the average thickness of the pixel defining layer 230.

For example, as shown in FIG. 2, within the cross section, a ratio of the length y3 of the connection surface 231c to L3 is greater than ⅓.

For example, as shown in FIG. 2 and FIG. 3, d5 is less than d2. For example, d5 is greater than the average thickness of the pixel defining layer 230.

For example, as shown in FIG. 2 and FIG. 3, the distance d3 is also greater than the length d1 of the portion, located on the first surface 221a of the first electrode 221, of the pixel defining portion 231. However, the embodiments of the present disclosure are not limited thereto. In another embodiments, the distance d3 may also be less than or equal to d1.

For example, as shown in FIG. 2 and FIG. 3, the length denoted by d2 of the portion, located on the second surface 221b of the first electrode, of the pixel defining portion 231 is greater than the distance d5 between the first concave point V1 and the first side surface 220a of the second groove 220.

Since the first electrode is retracted inwardly to form the first exposion portion, thereby increasing the distance between the first electrode and the second electrode layer and reducing the risk of short circuit therebetween. Therefore, the length d1 of the portion, covering the first surface 221a of the first electrode 221, of the pixel defining portion 231 may be reduced appropriately, which may be helpful to increase the size of the opening region and increase an opening ratio.

With reference to FIG. 2 and FIG. 3, the length d1 of the portion, located on the first surface 221a of the first electrode 221, of the pixel defining portion 231 is less than the length d2 of the portion, located on the second surface 221b of the first electrode, of the pixel defining portion 231.

For example, as shown in FIG. 2 and FIG. 3, the length d1 of the portion, located on the first surface 221a of the first electrode 221, of the pixel defining portion 231 is also less than the distance d3.

For example, d1 is also less than the average thickness of the pixel defining layer 230.

For example, as shown in FIG. 3, within the cross section and in the first direction, the first electrode 221a has a length f1, and a ratio of f1 to the distance d3 (also referred to as L1) ranges from 8 to 20.

For example, a ratio of d3 to y2 is greater than ½.

A too small distance d3 may be inconducive to increasing the distance between the first electrode 221 and the second electrode layer 212 and reducing the risk of short circuit. A too large distance d3 may be inconducive to increasing the opening ratio.

For example, the distance d3 ranges from 0.1 micron to 0.2 microns, for example, 0.12 microns or 0.15 microns.

For example, as shown in FIG. 2 and FIG. 3, the length d1 of the portion, located on the first surface 221a of the first electrode 221, of the pixel defining portion 231 is greater than the distance d5 of the first concave point V1 to the first side surface 220a of the second groove 220 in the first direction D1.

For example, as shown in FIG. 3, within the cross section, the length y1 of the portion, located on the side (close to the first electrode 221) of the first side surface 220a of the second groove 220, of the pixel defining portion 231 in the first direction D1 is greater than the maximum size d4 (also referred to as L5) of the second groove 220 in the first direction D1.

For example, within the cross section, the length y1 of the portion, located on the side (close to the first electrode 221) of the first side surface 220a of the second groove 220, of the pixel defining portion 231 in the first direction D1 is also greater than the distance d6 of the first concave point V1 to the second concave point V2 in the first direction.

The pixel defining portion 231 is designed to be longer on the side close to the first electrode 221 so that the insulating property of the pixel defining portion 231 can be improved and the risk of short circuit between the first electrode 221 and the second electrode layer 212 can be reduced. This may not be construed as limiting of the present disclosure.

For example, as shown in FIG. 3, within the cross section and in the first direction D1, the distance d3' (also referred to as L1') between the second side surface 220b of the second groove 220 and the second electrode 222 is greater than the distance d5' (also referred to as L2') between the second concave point V1 and the second side surface 220b of the second groove 220.

The inventors have found that a mask for manufacturing the pixel defining layer (PDL) 230 has a cyclic difference during the formation thereof due to the process, and such a cyclic difference leads to a cyclic difference in the size of the opening region 232 in the resulting pixel defining layer. Such a cyclic difference will eventually result in horizontal or vertical stripes during displaying and hence nonuniform display.

Figure 5A:
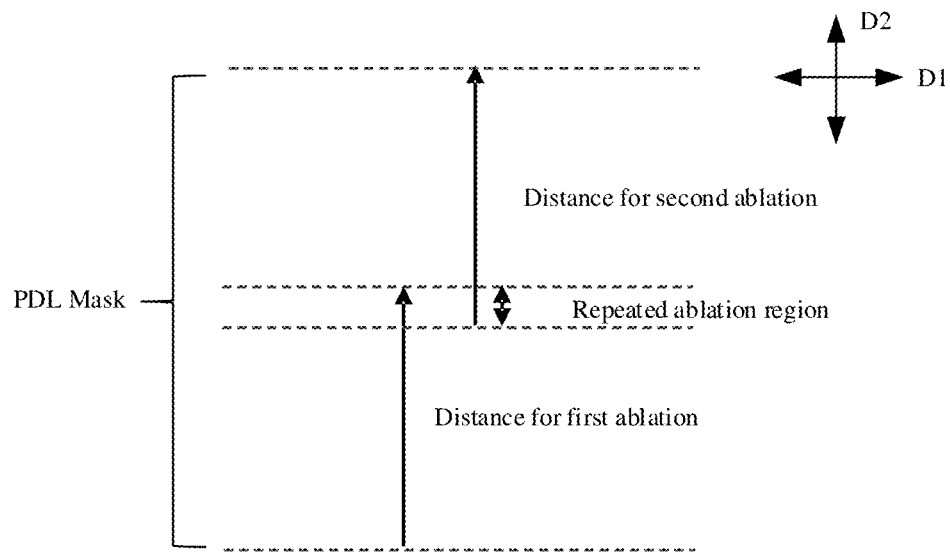
FIG. 5A is a schematic diagram of formation of a mask for a pixel electrode layer provided in some embodiments of the present disclosure.
Figure 5B:
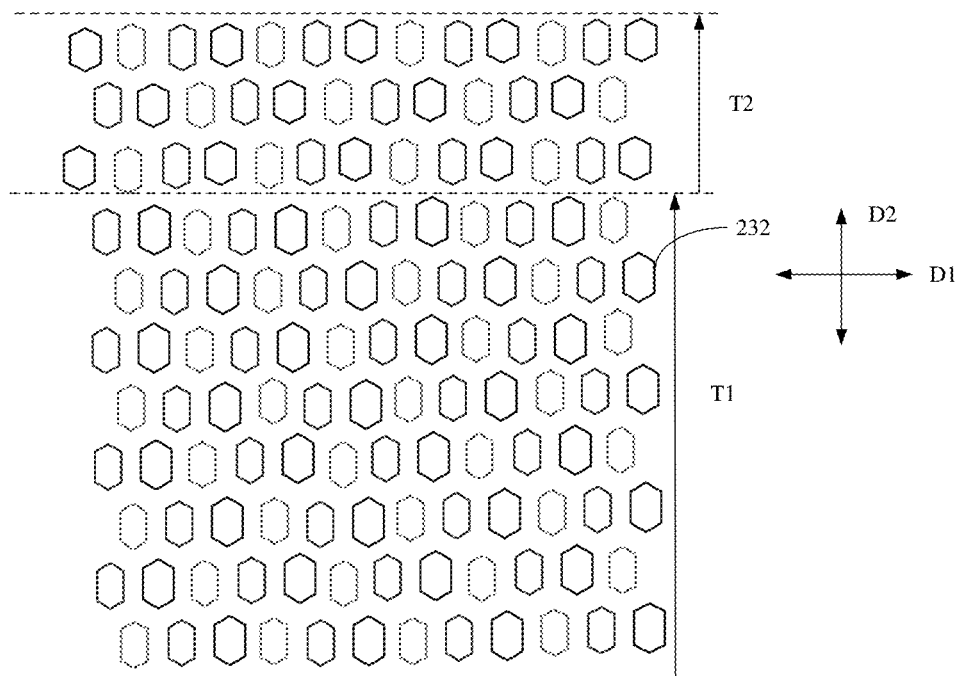
FIG. 5B is a planar schematic diagram of a pixel defining layer provided in some embodiments of the present disclosure.

FIG. 5A is a schematic diagram of formation of a mask for the pixel defining layer, and FIG. 5B is a planar schematic diagram of the pixel defining layer formed by using the mask. Only the opening region 232 in the pixel defining layer isschematically shown in FIG. 5B.

For example, during formation of the mask, a metal film (e.g., a chromium film) needs to be entirely coated first, and then laser ablation is performed on the metal film to form a mesh hole pattern. During the ablation, it is required to perform piecewise ablation. At the second ablation, to prevent omission of a segment, the ablation is performed after a return by a distance (6-8 um) to form a repeated ablation region. The repeated ablation region has a subtle difference from a single-pass ablation region. For example, the repeated ablation region has a greater mesh hole size than the single-pass ablation region. The opening regions of the pixel defining layer correspondingly exhibit a subtle regular difference, resulting in nonuniform display (such as regular horizontal stripes or vertical stripes) during displaying of the final display product, which in turn affects the display effect of the product. The nonuniform display phenomenon is particularly obvious on a high-resolution display product.

As shown in FIG. 5a, for example, a direction of ablation is a second direction D2 perpendicular to the first direction D1. In the second direction D2, the single-pass ablation region and the repeated ablation region are present alternately and cyclically. Correspondingly, as shown in FIG. 5B, the size of the opening region of the pixel defining layer formed by using the mask changes cyclically in the second direction D2. For example, the pixel defining layer has a segment T1 corresponding to the single-pass ablation region and a segment T2 corresponding to the repeated ablation region.

The inventors have also found that the severity of the nonuniform display is related to the size of the opening region. The larger the opening region, the less obvious the nonuniform display and the lower the influence. For example, as shown in FIG. 2, within the cross section, the smaller the length x1 of the opening region 232 of the first subpixel in the first direction D1, the more serious the influence of the cyclic difference in the size of the opening region 232 on display uniformity.

For example, the length of the opening region 232 in the first direction D1 may have different values in the thickness direction of the pixel defining layer. Since the effective light-emitting region of a subpixel is determined by the minimum of the length of the opening region 232 in the first direction D1, the length x1 of the opening region 232 in the first direction D1 is defined as the minimum. For example, as shown in FIG. 2, the opening region 232 has different sizes at the end close to the base substrate and the end far away from the substrate, and the size of the opening region 232 at the end away from the base substrate, i.e., the minimum size, is taken as x1.

In the display substrate provided by at least one embodiment of the present disclosure, the length d1 of the portion of the pixel defining portion 231 located on the first surface 221a of the first electrode 221 is narrowed so that the length x1 of the opening region 232 is increased. This is helpful to not only increase the opening ratio of the display substrate but also reduce the influence of the cyclic difference in the size of the opening region 232 on display uniformity. Accordingly, the display uniformity of the display substrate is improved.

Figure 6:
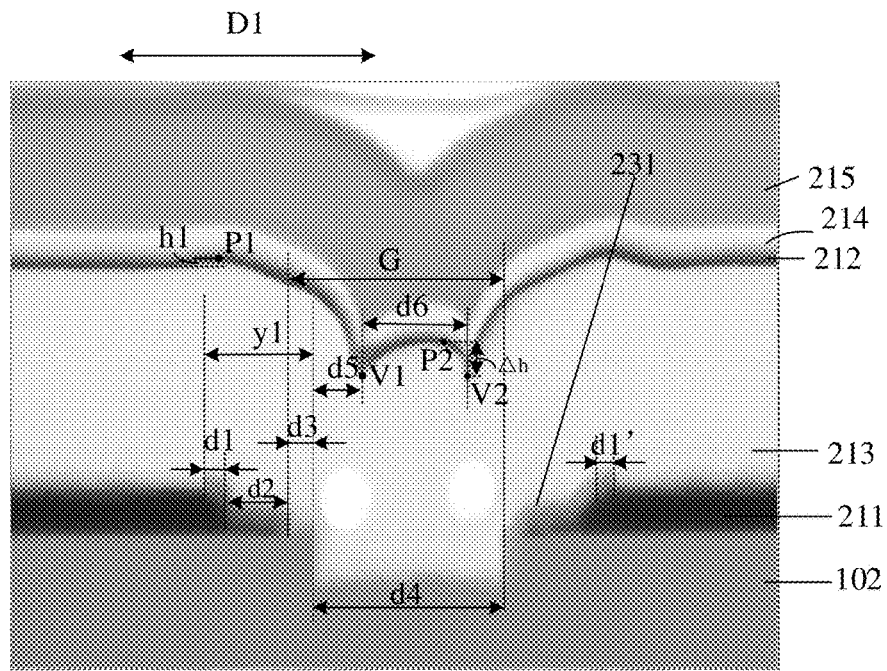
FIG. 6 is a third sectional view of a display substrate provided in some embodiments of the present disclosure.

FIG. 6 illustrates another examples of an electron microscope image of the display substrate shown in FIG. 1 taken along section line A-A'. With reference to FIG. 2 and FIG. 6, the length d1 of the portion of the pixel defining portion 231 located on the first surface 221a of the first electrode 221 (i.e., the portion overlapping the first surface 221a in the direction perpendicular to the base substrate) is less than the length d2 of the portion of the pixel defining portion 231 located on the second surface 221b of the first electrode (i.e., the portion overlapping the second surface 221b in the direction perpendicular to the base substrate).

For example, as shown in FIG. 2 and FIG. 6, the length d1 of the portion, located on the first surface 221a of the first electrode 221, of the pixel defining portion 231 is also less than the distance d3 of the first side surface 220a of the second groove 220 to the first electrode edge 221c of the first electrode 221.

For example, d1 is also less than the average thickness of the pixel defining layer 230.

For example, as shown in FIG. 2 and FIG. 6, the length d1 of the portion, located on the first surface 221a of the first electrode 221, of the pixel defining portion 231 is also less than the distance d5 of the first concave point V1 to the first side surface 220a of the second groove 220 in the first direction D1.

For example, within the cross section shown in FIG. 2, the length y1 of the portion, on the side close to the first electrode 221, of the pixel defining portion 231 in the first direction D1 is greater than the distance d6 of the first concave point V1 to the second concave point V2 in the first direction.

The pixel defining portion 231 is designed to be longer on the side close to the first electrode 221 so that the insulating property of the pixel defining portion 231 can be improved and the risk of short circuit between the first electrode 221 and the second electrode layer 212 can be reduced. This may not be construed as limiting of the present disclosure.

For example, as shown in FIG. 6, within the cross section, the length y1 of the portion, on the side close to the first electrode 221, of the pixel defining portion 231 in the first direction D1 is less than the maximum size d4 of the second groove 220 in the first direction D1.

For example, as shown in FIG. 6, within the cross section shown, the length y1 of the portion, located on the side (close to the first electrode 221) of the first side surface 220a of the second groove 220, of the pixel defining portion 231 in the first direction D1 is less than the distance d6 of the first concave point V1 to the second concave point V2 in the first direction D1.

For example, within the cross section, the length y1 of the portion, located on the side (close to the first electrode 221) of the first side surface 220a of the second groove 220, of the pixel defining portion 231 in the first direction D1 is also less than the distance d6 of the first concave point V1 to the second concave point V2 in the first direction.

In case of a certain pixel density, the smaller the y1, the smaller the gap between the opening regions 232 of adjacent subpixels and the larger the opening region 232 of the subpixel. This is helpful to not only increase the opening ratio of the display substrate but also reduce the influence of the cyclic difference in the size of the opening region 232 on display uniformity. Accordingly, the display uniformity of the display substrate is improved.

For example, as shown in FIG. 2 and FIG. 6, the second electrode 222 includes a first surface 222a which is far away from the base substrate and parallel to the plate surface of the base substrate. Within the cross section and in the first direction D1, a portion, located on the first surface 222a of the second electrode 222, of the pixel defining portion 231 has a length denoted by d1'. The length d1' of the portion, located on the first surface 222a of the second electrode 222, of the pixel defining portion 231 is not equal to the length d1 of the portion, located on the first surface 221a of the first electrode 221, of the pixel defining portion 231. For example, as shown in FIG. 2, d1 is less than d1'.

Through the above settings, the size x1 of the opening region 231 of the first subpixel in the first direction D1 is different from the size x2 of the opening region 231 of the second subpixel in the first direction D1, so that the first subpixel and the second subpixel located within the same cycle of the pixel defining layer (e.g., both located at the segment T1 or the segment T2 of the pixel defining layer) have opening regions of different sizes, which disturbs the regularity of the opening regions of the subpixels within the same cycle and avoids the occurrence of horizontal stripes or vertical strips. Accordingly, the display uniformity is improved.

For example, as shown in FIG. 6, the second electrode layer 212 includes a first protrusion portion 241 that corresponds to the position between the first surface 221a and the second surface 221b of the first electrode 221. For example, the first protrusion portion 241 results from the segment difference between the first surface 221a and the second surface 221b of the first electrode 221 or from the pixel defining portion 231.

For example, in the direction perpendicular to the base substrate, the first protrusion portion 241 overlaps, at least in part, each of the first surface and the second surface.

The first protrusion portion 241 has a first protrusion point P1 within the cross section. For example, the protrusion portion 241 is further away from the base substrate at the first protrusion point P1 than at the periphery of the first protrusion point P1 (e.g., in a range of 10 nanometers, 30 nanometers or 50 nanometers centered on the first protrusion point P1).

For example, the protrusion height h1 of the first protrusion point P1 is greater than the average thickness of the second electrode layer 212. For example, the protrusion height h1 is based on the plane of the second electrode layer 212 that is parallel to the first direction D1 (i.e., parallel to the surface of the base substrate).

For example, as shown in FIG. 2 and FIG. 3, the concave structure 130 further includes a second protrusion point P2 within the cross section. The second protrusion point P2 is located between the first concave point V1 and the second concave point V2. The distance of the second protrusion point P2 to the base substrate is greater than the distance of each of the first concave point V1 and the second concave point V2 to the base substrate. For example, the second electrode layer 212 is further away from the base substrate at the second protrusion point P2 than at the periphery of the second protrusion point P2 (e.g., in a range of 10 nanometers, 30 nanometers or 50 nanometers centered on the second protrusion point P2).

For example, a greater value Δh of a height difference between the second protrusion point P2 and the first concave point and a height difference between the second protrusion point P2 and the second concave point is the protrusion height of the second protrusion point P2. As shown in FIG. 3, since the second concave point V2 is closer to the base substrate than the first concave point V1, the protrusion height Δh of the second protrusion point P2 is the height difference between the second protrusion point P2 and the second concave point V2.

For example, Δh is greater than the height difference between the first concave point and the second concave point.

For example, Δh is greater than the average thickness of the second electrode layer 212.

For example, as shown in FIG. 6, Δh is greater than the protrusion height h1 of the first protrusion point P1.

For example, the second electrode layer 212 shown in FIG. 6 is flatter than the second electrode layer 212 shown in FIG. 3. For example, the protrusion height h1 of the first protrusion point P1 shown in FIG. 6 is less than the protrusion height h1 of the first protrusion point P1 shown in FIG. 3.

Figure 7:
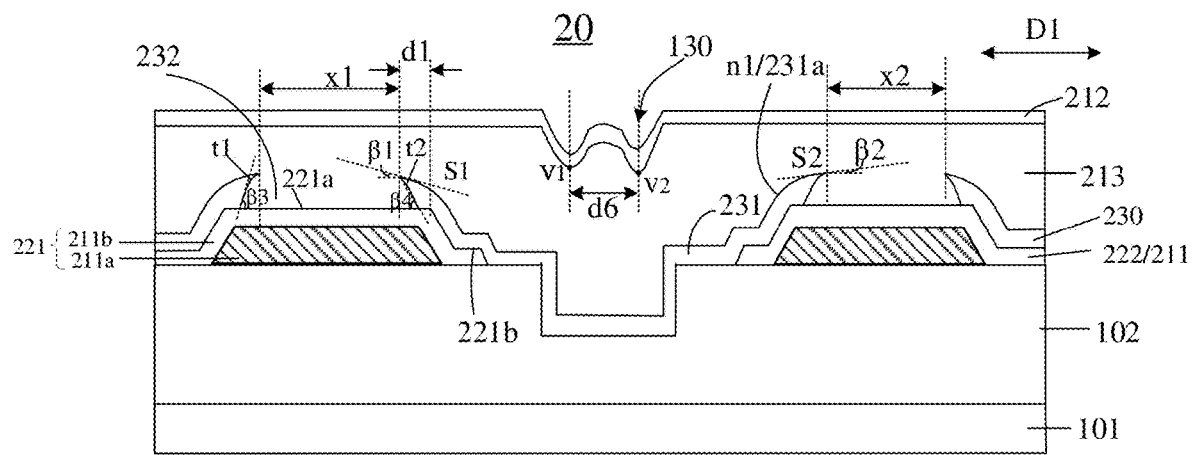
FIG. 7 is a fourth sectional view of a display substrate provided in some embodiments of the present disclosure.

FIG. 7 is a schematic diagram of a display substrate provided in another embodiments of the present disclosure. For the sake of clarity, the circuit structure below the first electrode layer is omitted in the figure. As shown in FIG. 7, the pixel defining portion 231 includes a first surface 231a far away from the base substrate 101. The orthographic projection of the first surface 231a of the pixel defining portion 231 on the cross section shown in FIG. 7 is a first curve n1. The first curve n1 is an upper outline of the pixel defining portion 231 within the cross section. A first tangent line S1 at the endpoint, which is close to the first electrode 221, of the first curve n1 intersects the first direction D1.

The morphology of the end, close to the first electrode/the second electrode, of the pixel defining portion 231 is liable to influence the size of the opening region of the subpixel. Therefore, in at least one embodiment of the present disclosure, the end(s), close to the first electrode and/or the second electrode, of the pixel defining portion 231 may be formed into a tilted structure so that the size of the opening region can be fine adjusted easily, thereby disturbing the cyclic regularity of the opening regions and improving the display uniformity.

For example, as shown in FIG. 7, a second tangent line S2 of the first curve n1 at an endpoint close to the second electrode 222 intersects the first direction D1. For example, the first tangent line S1 intersects the second tangent line S2.

For example, as shown in FIG. 7, the first tangent line S1 forms a first included angle β1 with the first direction, while the second tangent line S2 forms a second included angle β2 with the first direction, and the first included angle β1 is not equal to the second included angle β2.

Through the above settings, the two ends, close to the first electrode and the second electrode, of the pixel defining portion 231 are different in morphology so that the two ends of the pixel defining portion 231 can have opening regions of different sizes, which may be helpful to improve the display uniformity.

For example, an intersection point of the first tangent line S1 and the base substrate is located on the side, close to the second electrode 222, of the first electrode 221, and an intersection point of the second tangent line S2 and the base substrate is located on the side, close to the first electrode 221, of the second electrode 222. In other words, the two ends, close to the first electrode and the second electrode, respectively, of the pixel defining portion 231 are tilted upwards (i.e., in the direction far away from the base substrate).

For example, the structure of the opening region described above may be formed by performing dry etching first and then wet etching in the patterning process of the material of the pixel defining layer. Due to high precision of the dry etching, the opening region may be positioned and a rough outline of the opening region may be formed. The wet etching is then performed to form the morphology of the final opening region. Since the wet etching has lower precision than the dry etching and is random, the morphology of the opening region can be fine adjusted randomly by performing the wet etching after the dry etching. Accordingly, the regularity of the opening regions can be broken and the display uniformity can be improved. For example, the duration of the dry etching is longer than that of the wet etching.

For example, since the wet etching is isotropic and transverse undercutting may occur easily during the etching, the end of the pixel defining portion is prone to being formed into the upwards tilted structure as shown in FIG. 7. The cross-section shape of the opening region is approximated as a right trapezoid. In other words, the opening region 232 has a smaller size at the end far away from the base substrate than at the end close to the base substrate.

For example, as shown in FIG. 7, the opening region 232 of the first subpixel has opposite first edge t1 and second edge t2 in the first direction D1 within the cross section. The first edge t1 forms an included angle β3 with the first surface 221a of the first electrode 221, while the second edge t2 forms an included angle β4 with the first surface 221a of the first electrode 221, and β3 is not equal to β4.

Figure 8:
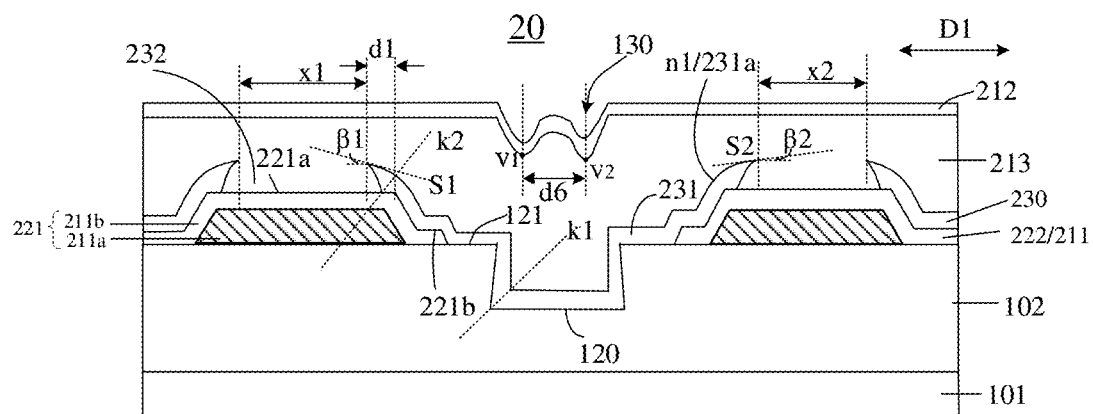
FIG. 8. is a fifth sectional view of a display substrate provided in some embodiments of the present disclosure.

FIG. 8. is a schematic diagram of a display substrate provided in still another embodiments of the present disclosure. The display substrate shown in FIG. 8 differs from the display substrate shown in FIG. 2 mainly in that the cross-section shape of the first groove 120 is a right trapezoid.

For example, as shown in FIG. 8, the right trapezoid has a first base angle close to the first electrode 221 and a second base angle close to the second electrode 222. For example, the first base angle is not equal to the second base angle.

For example, within the cross section shown in FIG. 8, the end portion, close to the first electrode 221, of the pixel defining portion 231 has a third base angle, and the angular bisector k2 of the third base angle is not parallel to the angular bisector k1 of the first base angle.

It needs to be noted that features in the same embodiment and those in different embodiments of the present disclosure may be combined with one another in a non-conflicting manner.

For example, the base substrate 101 may be silicon such as monocrystalline silicon or high purity silicon. The dielectric layer 102 may be an oxide, a nitride or an oxynitride of silicon that is formed on the silicon. The base substrate 101 and the dielectric layer 102 form a driving substrate 201, and the driving circuits of the subpixels can be integrated in the driving substrate 201 and are electrically connected to the pixel electrodes (e.g., the first electrode 221 and the second electrode 222) through contact holes in the dielectric layer 102 to drive the light-emitting elements to emit light.

For example, an active layer (i.e., a semiconductor layer), a first pole and a second pole of a transistor are formed in the driving substrate 201 by doping, and an insulating layer is formed by silicon oxidation. Moreover, a plurality of conducting layers 105, 106 and the like are formed by sputtering. The semiconductor layer (e.g., the active layer 322 in FIG. 2) of the transistor is located within the base substrate 101 or formed as a portion of the base substrate 101.

For example, a pixel driving circuit includes a CMOS circuit. For example, the gate driving circuit 6 and the data driving circuit 7 described above may also be integrated in the driving substrate 201 by the above-mentioned semiconductor processes. The gate driving circuit and the data driving circuit may take the form of a conventional circuit structure in the art, which will not be limited in the embodiments of the present disclosure.

As shown in FIG. 2, the first electrode 221 and the second electrode 222 are formed on a surface of the driving substrate 201 and electrically connected to the first pole 323 of a first transistor 203 through the contact holes 103 filled with a conducting material (e.g., tungsten) and the plurality of conducting layers. Two conducting layers 105, 106 are exemplarily illustrated above the transistor in FIG. 2. However, the number of the conducting layers is not limited in the embodiments of the present disclosure.

For example, as shown in FIG. 2, the topmost conducting layer 106 in the driving substrate 201 is reflexive, and has, for example, a stacked structure of titanium/titanium nitride/aluminum. For example, the conducting layer 106 includes a plurality of sublayers that are spaced apart from one another and correspond to a plurality of pixel electrodes (e.g., the first electrode 221 and the second electrode 222) in the first electrode layer 211 one to one. In a top-emitting structure, the conducting layer 106 may be provided as a reflecting layer for reflecting light emitted by the light-emitting element, thereby improving the light emission efficiency. For example, the orthographic projection of each pixel electrode in the first electrode layer 211 on the base substrate 101 falls into the orthographic projection of a portion, corresponding to the pixel electrode, of the conducting layer 106 on the base substrate 101.

Relying upon the mature CMOS integrated circuit technology, silicon based process can achieve high accuracy (e.g., PPI may be 6500 or even above ten thousand). For example, the gap G between the first second 221 and the second electrode 222 has a length of less than 1 micron, such as from 700 nanometers to 900 nanometers, in the first direction.

For example, the light-emitting element may be an OLED or a quantum dot light emitting diode (QLED). The embodiments of the present disclosure have no particular limitation on the type of the light-emitting element. For example, a light-emitting layer of the OLED may be made of a small molecular organic material or a high molecular organic material.

The organic functional layer 213 includes a plurality of functional sublayers that are stacked on one another in the direction perpendicular to the base substrate 101. At least one of the plurality of functional sublayers is broken at the corresponding first groove 120.

For example, the plurality of functional sublayers include at least one carrier injection layer and at least one light-emitting layer. The carrier injection layer may be an electron injection layer (EIL) or a hole injection layer (HIL). The EIL is located on the side, close to the cathode, of the light-emitting layer and configured to reduce the barrier for injection of electrons from the cathode, allowing electrons to be effectively injected into the light-emitting layer from the cathode. The HIL is located on the side, close to the anode, of the light-emitting layer and configured to reduce the barrier for injection of holes from the anode, allowing holes to be effectively injected into the light-emitting layer from the anode. Therefore, when selecting the material of the EIL/HIL, it is necessary to consider matching of the energy level of the material with the material of the electrode. For example, the material of the EIL may be LiQ (lithium 8-hydroxyquinolinate), AlQ3 (aluminum 8-hydroxyquinolinate), etc. The material of the HIL may be CuPc (copper phthalocyanine), TiOPc, m-MTDATA, 2-TNATA, etc.

For example, the organic functional layer 213 may also include an electron/hole transport layer, an electron/hole blocking layer, a charge generation layer, etc.

For example, to improve the light emission efficiency and increase the color gamut of the light-emitting device, a plurality of light-emitting layers stacked on one another may also be used to emit white light. In other words, the organic functional layer 213 includes a plurality of light-emitting layers that are stacked in the direction perpendicular to the base substrate 101. For example, the organic functional layer 213 includes two light-emitting layers (yellow and blue) or three light-emitting layers (red, green and blue) stacked on one another.

For example, at least two of the plurality of light-emitting layers are connected in series with each other through a charge generation layer (CGL) to form a tandem structure. The CGL includes an N-type CGL and a P-type CGL and is configured to balance the transport of carriers. The N-type CGL may be formed by an organic layer doped with an alkali metal such as lithium (Li), sodium (Na), potassium (K) or cesium (Cs) or an alkaline-earth metal such as magnesium (Mg), strontium (Sr), barium (Ba) or radium (Ra) (but not limited to any of them). The P-type CGL may be formed by an organic layer obtained by doping an organic matrix having hole transport capability with a dopant. The tandem structure is helpful to improve the light emission efficiency and the luminance of a device.

For example, since the CGL includes a metal element, electric leakage is easy to occur between subpixels to cause cross color. In the display substrate provided in at least one embodiment of the present disclosure, the organic functional layer 213 is provided with the concave structure 130 corresponding to the position between subpixels so that the CGL is naturally broken at the concave structure 130 due to a large segment difference. Thus, cross color between subpixels caused by transverse electric leakage of the organic functional layer can be effectively prevented. The color gamut of the display substrate can be increased and the display quality can be improved.

Referring continuously to FIG. 2, FIG. 2 illustrates a first transistor 203 and a second transistor 204 that are electrically connected to the light-emitting elements of the first subpixel and the second subpixel, respectively. The embodiments of the present disclosure have no particular limitation on the specific type of the first transistor 203 and the second transistor 204. The first transistor 203 is described below as an example. The following description is also appropriate for the second transistor 204, and thus will not be repeated.

For example, the first transistor 203 includes a gate 321, a gate insulating layer 325, an active layer 322, a first pole 323, and a second pole 324. The embodiments of the present disclosure have no particular limitations on the type, material and structure of the first transistor 203. For example, the first transistor may be of a top gate type, a bottom gate type, etc. The active layer of the first transistor 203 may be an inorganic semiconductor material such as microcrystalline silicon, amorphous silicon, polycrystalline silicon (low temperature polycrystalline silicon or high temperature polycrystalline silicon), an oxide semiconductor (e.g., indium gallium zinc oxide (IGZO)), or an organic material, for example, an organic semiconductor material such as poly-(2,5-bis(3-alkylthiophene-2-yl)thieno[3,2-b]thiophene) (PBTTT), poly{2,2'-[(2,5-bis(2-octyldodecyl)-3,6-dioxo-2,3,5,6-tetrahydropyrrolo[3,4-c]pyrrole-1,4-di yl)]dithiophene-5,5'-diyl-alt-thieno[3,2-b]thiophene-2,5-diyl} (PD-BT-co-TT), poly{2,2'-[(2,5-bis(2-octyldodecyl)-3,6-dioxo-2,3,5,6-tetrahydropyrrolo[3,4-c]pyrrole-1,4-di yl)]dithiophene-5,5'-diyl-alt-2,2'-bithiophene-5,5'-diyl} (PDQT), poly{3,6-dithiophen-2-yl-2,5-di(2-decyltetradecyl)-pyrrolo[3,4-c]pyrrole-1,4-dione-alt-thieny lenevinylene-2,5-yl} (PD-VT-10), dinaphthothienothiophene (DNTT) or pentacene. For example, the first transistor 203 may be of N type or P type.

It needs to be noted that all the transistors used in the embodiments of the present disclosure may be thin film transistors, field effect transistors or other switching devices having the same characteristics. A field effect transistor (e.g., MOS field effect transistor) formed on a silicon substrate is described as an example in some embodiments of the present disclosure. In this example, the silicon substrate is doped (p-type doped or n-type doped) to form the active layer of the transistor. In other words, the active layer of the transistor is located in the silicon substrate. Alternatively, the active layer of the transistor is a portion of the silicon substrate. The source and the drain of a transistor used herein may be structurally symmetrical and thus may be structurally indistinguishable. In an embodiment of the present disclosure, to distinguish between other two poles than the gate of a transistor, one pole may be directly described as the first pole, while the other pole as the second pole.

For example, as shown in FIG. 3 and FIG. 6, the display substrate 20 may further include a light extraction layer 214 located on the side, far away from the base substrate, of the second electrode layer 212. For example, the light extraction layer 214 has a refractive index greater than that of a second conducting layer 212 so that the light emission efficiency can be improved.

For example, as shown in FIG. 3 and FIG. 6, the display substrate 20 may further include a capping layer 215 located on the side, far away from the base substrate, of the light extraction layer 214. For example, the capping layer 215 is configured to seal the light-emitting element to prevent external moisture and oxygen from infiltration to the light-emitting element and the pixel circuit to cause damage to the device. For example, the capping layer 215 includes an organic thin film or includes a structure of organic and inorganic thin films stacked alternately. For example, a water absorbing layer may also be disposed between the capping layer 215 and the light-emitting element. The water absorbing layer is configured to absorb residual water vapor or sol on the light-emitting element resulting from the pre-production process.

For example, as shown in FIG. 3, the display substrate 20 may further include a color film 216 located on the side, far away from the base substrate, of the capping layer 215. For example, the light-emitting element of the display substrate is configured to emit white light and combined with the color film to realize full-color display.

For example, the display substrate 20 is an OLED display substrate or a micro OLED display substrate.

Figure 9:
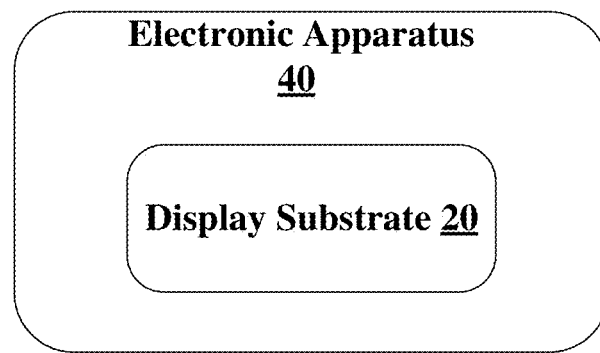
FIG. 9 is a schematic diagram of an electronic apparatus provided in some embodiments of the present disclosure.

Embodiments of the present disclosure further provide an electronic apparatus including the display substrate 20 described above. FIG. 9 is a schematic diagram of an electronic apparatus 40 provided in at least one embodiment of the present disclosure. For example, the electronic apparatus 40 is any product or component with the display function, such as a digital photo frame, a smart bracelet, a smart watch, a mobile phone, a tablet computer, a display, a notebook computer, and a navigator.

What have been described above merely are specific implementations of the present disclosure, and the protection scope of the present disclosure is not limited thereto. The protection scope of the present disclosure should be based on the protection scope of the claims.

What is claimed is:
1. A display substrate, comprising:
a base substrate comprising a first subpixel region and a second subpixel region adjacent to each other,
a dielectric layer located on the base substrate, and
a first electrode layer, a pixel defining layer, an organic functional layer and a second electrode layer which are stacked successively on a side, away from the base substrate, of the dielectric layer and, the first electrode layer comprising a first electrode in the first subpixel region and a second electrode in the second subpixel region, wherein the pixel defining layer comprises a first opening region, a second opening region, and a pixel defining portion located between the first opening region and the second opening region;

the first opening region exposes at least a portion of the first electrode, and the second opening region exposes at least a portion of the second electrode, and the pixel defining portion further covers a portion of the first electrode and a portion of the second electrode;

the first electrode comprises a first surface and a second surface which are away from the base substrate, and the second surface of the first electrode is closer to the base substrate than the first surface of the first electrode;

the display substrate has a cross section perpendicular to the base substrate; within the cross section and along a first direction parallel to a plate surface of the base substrate, a portion of the pixel defining portion on the first surface of the first electrode has a length denoted by d1, and a portion of the pixel defining portion on the second surface of the first electrode has a length denoted by d2; d1 is less than d2.

2. The display substrate according to claim 1, wherein the first electrode comprises a first sub-electrode and a second sub-electrode which are stacked, and the second sub-electrode is on a side, which is away from the dielectric layer, of the first sub-electrode; and the second sub-electrode covers a side surface of the first sub-electrode and is in contact with the dielectric layer to form the second surface of the first electrode.

3. The display substrate according to claim 1, wherein a portion, which is in contact with the second surface of the first electrode, of the pixel defining portion has an average thickness greater than an average thickness of the first electrode at the second surface.

4. The display substrate according to claim 1, wherein a gap is present between the first electrode and the second electrode;

a portion, which is corresponding to the gap, of the dielectric layer comprises a first groove, and the gap exposes the first groove; the pixel defining portion covers the first groove to form a second groove;

the gap further exposes a first exposion portion of the dielectric layer; the first exposion portion is between a first electrode edge of the first electrode close to the first groove, and a first groove edge of the first groove facing the first electrode; and within the cross section and along the first direction, a distance between a first side surface, close to the first electrode, of the second groove and the first electrode edge is denoted by d3, and d3 is greater than d1.

5. The display substrate according to claim 4, wherein within the cross section and in the first direction, a portion, which is on a side of the first side surface of the second groove close to the first electrode, of the pixel defining portion has a length denoted by y1, and the second groove has a maximum length denoted by d4; and y1 is less than d4.

6. The display substrate according to claim 5, wherein a portion, corresponding to the first groove, of the second electrode layer comprises a concave structure; the concave structure comprises a first concave point and a second concave point within the cross section; orthographic projections of the first concave point and the second concave point on the base substrate are both within an orthographic projection of the second groove on the base substrate; and a distance between the first concave point and the first side surface of the second groove in the first direction is denoted by d5, and d5 is greater than d1.

7. The display substrate according to claim 6, wherein a distance between the first concave point and the second concave point in the first direction is denoted by d6, and y1 is greater than d6.

8. The display substrate according to claim 6, wherein the first concave point and the second concave point have different distances to the base substrate.

9. The display substrate according to claim 6, wherein the second electrode layer comprises a protrusion portion which is at least partially overlapped with the first electrode in a direction perpendicular to the base substrate;

the protrusion portion has a first protrusion point within the cross section; and a protrusion height of the first protrusion point is greater than an average thickness of the second electrode layer.

10. The display substrate according to claim 9, wherein the concave structure further comprises a second protrusion point within the cross section, and the second protrusion point is between the first concave point and the second concave point; a distance of the second protrusion point to the base substrate is greater than a distance of each of the first concave point and the second concave point to the base substrate; and a greater value of a height difference between the second protrusion point and the first concave point and a height difference between the second protrusion point and the second concave point is denoted by Δh.

11. The display substrate according to claim 10, wherein Δh is greater than a height difference between the first concave point and the second concave point.

12. The display substrate according to claim 10, wherein Δh is less than the protrusion height of the first protrusion point.

13. The display substrate according to claim 6, wherein the second electrode layer has different thicknesses at the first concave point and the second concave point.

14. The display substrate according to claim 1, wherein the pixel defining portion comprises a first surface away from the base substrate;

an orthographic projection of the first surface on the cross section is a first curve, the first curve has a first tangent line at an endpoint close to the first electrode, and the first tangent line intersects the first direction.

15. The display substrate according to claim 14, wherein the first curve has a second tangent line at an endpoint close to the second electrode, and the second tangent line intersects the first direction; and the first tangent line and the second tangent line form different included angles with the first direction.

16. The display substrate according to claim 14, wherein an intersection point of the first tangent line and the plate surface of the base substrate is on a side, close to the second electrode, of the first electrode.

17. The display substrate according to claim 1, wherein the first opening region has a length different from a length of the second opening region in the first direction.

18. The display substrate according to claim 1, wherein the first opening region has a first edge and a second edge which are within the cross section and are opposite in the first direction; and the first edge and the second edge form different included angles with the first surface of the first electrode.

19. The display substrate according to claim 1, wherein the second electrode comprises a first surface away from the base substrate, and the first surface of the second electrode is parallel to the surface of the base substrate;
within the cross section and in the first direction, a portion of the pixel defining portion on the first surface of the second electrode has a length denoted by $d1'$; and
$d1$ is not equal to $d1'$.

20. An electronic apparatus, comprising the display substrate according to claim 1.

* * * * *